United States Patent
Miyake et al.

(10) Patent No.: US 6,888,652 B2
(45) Date of Patent: May 3, 2005

(54) METHOD AND APPARATUS FOR ALIGNING AN OPTICAL DEVICE

(75) Inventors: Atsushi Miyake, Osaka (JP); Akimitsu Sato, Osaka (JP); Takashi Fukuzawa, Osaka (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 87 days.

(21) Appl. No.: 10/084,785

(22) Filed: Feb. 25, 2002

(65) Prior Publication Data

US 2002/0118426 A1 Aug. 29, 2002

(30) Foreign Application Priority Data

Feb. 28, 2001 (JP) .................................. 2001-053401

(51) Int. Cl.$^7$ .................................................. G02B 26/08
(52) U.S. Cl. ...................................... 359/196; 359/223
(58) Field of Search .............................. 359/196, 223, 359/226, 212; 356/73.1, 138, 139, 399, 153, 152.2; 385/52, 88, 90, 34

(56) References Cited

U.S. PATENT DOCUMENTS

| | | | | |
|---|---|---|---|---|
| 4,509,827 A | * | 4/1985 | Cowen et al. | 356/153 |
| 5,859,947 A | * | 1/1999 | Kiryuscheva et al. | 385/136 |
| 6,168,319 B1 | * | 1/2001 | Francis | 385/79 |
| 6,205,266 B1 | * | 3/2001 | Palen et al. | 385/15 |
| 6,374,012 B1 | * | 4/2002 | Bergmann et al. | 385/33 |
| 6,480,651 B1 | * | 11/2002 | Rabinski | 385/52 |

OTHER PUBLICATIONS

Model 1435 Laser Cavity Mirror Mount. Datasheet [online]. Oriel, Inc., Feb. 14, 2001 [retrieved on Jun. 24, 2004]. Retrieved from the Internet (archive.org): <URL:web.archive.org/web/20010501151212/www.oriel.com/netcat/volumnei/descrippage/v1t3cave.html>.*

* cited by examiner

Primary Examiner—Euncha P. Cherry
(74) Attorney, Agent, or Firm—Crompton, Seager & Tufte, LLC (57) ABSTRACT

A method of aligning a fiber collimator in a short time. Light emitted from a collimator is reflected by a mirror. Reflected light passes through the collimator, and is measured by a light intensity measuring device. Rotating bodies rotatably support the mirror about an X-axis and a Y-axis orthogonal to the optical axis. An aligner simultaneously drives the rotating bodies to scan an optimal angle for the mirror. With the mirror fixed at the optimal angle, the distance between a collimation lens of the collimator and the optical fiber is changed. Subsequently, the optimal angle of the mirror is again scanned.

29 Claims, 9 Drawing Sheets

METHOD AND APPARATUS FOR ALIGNING AN OPTICAL DEVICE

BACKGROUND OF THE INVENTION

The present invention relates to a method and an apparatus for aligning an optical device such as a collimator.

Figure 13:
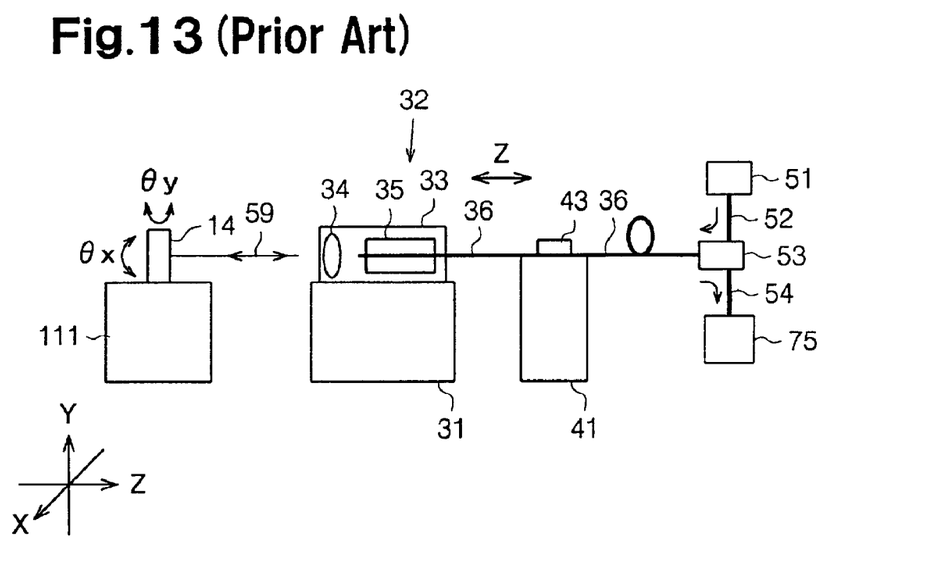
FIG. 13 is a schematic diagram of a conventional fiber collimator aligner.

FIG. 13 is a schematic diagram illustrating a conventional fiber collimator aligner. The fiber collimator aligner optimizes a fixed position of an optical fiber 36 with respect to a capillary 35 to align a collimator 32. More specifically, in the conventional aligner, light emitted from a light source 51 reaches a mirror 14 through a first branch optical fiber 52 and an optical splitter 53. The light 59 reflected by the mirror 14 is converged by a collimation lens 34 and impinges on a light intensity measuring device 75 through an optical fiber 36, an optical splitter 53 and a second branch optical fiber 54. The light intensity measuring device 75 measures the intensity of the reflected light 59. A pedestal 111 rotatably supports the mirror 14 about an X-axis or a Y-axis to change the angle of the mirror 14 to the optical axis.

A conventional aligning method is performed in the following manner. First, the mirror 14 is rotated about the X-axis such that the light intensity detected by the light intensity measuring device 75 reaches a maximum to adjust the angle of the mirror 14. Next, the position of the optical fiber 36 with respect to the collimation lens 34 is changed along the Z-axis such that the light intensity measured by the light intensity measuring device 75 reaches the maximum. The mirror 14 is again rotated about the Y-axis such that the light intensity detected by the light intensity measuring device 75 reaches the maximum. After adjusting the angle of the mirror 14, the position of the optical fiber 36 in the Z-axis direction is changed such that the light intensity measured by the light intensity measuring device 75 reaches the maximum. After locating an optimized position by repetitions of the forgoing operations, the optical fiber 36 is fixed to the capillary 35 at that position.

In the foregoing manner, the conventional aligning method and the aligner independently swing the mirror 14 in the vertical direction and in the horizontal direction. In other words, the pedestal 111 changes the angle of the mirror 14 with respect to the optical axis separately about the X-axis and Y-axis. Therefore, the aligning operation involves a trial and error process in which the mirror 14 is rotated about one axis such that a measured value of the light intensity measuring device 75 reaches the maximum, followed by an adjustment of the position of the optical fiber 36 in the Z-axis direction. As a result, the aligning operation takes a long time.

SUMMARY OF THE INVENTION

It is an object of the present invention to provide a method and an apparatus for aligning an optical device which reduce a time required for an aligning operation. It is another object of the present invention to provide a scanning method, and a light intensity testing method and an apparatus which reduce a time required for detecting an optimized position at which a light intensity reaches the maximum.

To achieve the above objects, the present invention provides a scanning method for moving an optical element positioned on an optical axis of light within a predetermined scanning range. The method includes moving the optical element at a first speed in a first direction intersecting the optical axis; and moving the optical element at a second speed different from the first speed in a second direction intersecting the first direction.

A further perspective of the present invention is a method of testing the intensity of light incident on an optical element positioned on an optical axis of light. The method includes moving the optical element at a first speed in a first direction intersecting the optical axis; moving the optical element at a second speed different from the first speed in a second direction intersecting the first direction simultaneously with the movement in the first direction; and measuring the intensity of the light while moving the optical element.

A further perspective of the present invention is a method of aligning a work positioned on an optical axis of light. The method includes moving an optical element positioned to substantially oppose the work at a first speed in a first direction intersecting the optical axis; moving the optical element at a second speed different from the first speed in a second direction intersecting the optical axis and the first direction, simultaneously with the movement in the first direction; measuring the intensity of the light while moving the optical element; and aligning the work based on the result of measurement.

A further perspective of the present invention is a scanner comprising an optical element positioned on an optical axis of light; a scanning mechanism for movably holding the optical element in a first direction intersecting the optical axis and for movably holding the optical element in a second direction intersecting the optical axis and the first direction, simultaneously with a movement in the first direction; and a controller for controlling the scanner, the controller moving the optical element at a first speed in the first direction and moving the optical element at a second speed different from the first speed in the second direction.

A further perspective of the present invention is a tester for testing a work comprising an optical element positioned on an optical axis of light; a scanning mechanism for movably holding the optical element in a first direction intersecting the optical axis and for movably holding the optical element in a second direction intersecting the optical axis and the first direction, simultaneously with a movement in the first direction; an optical sensor for measuring the intensity of light passing through the work; and a controller for testing the work based on the measured intensity of light, the controller controlling the scanning mechanism to move the optical element at a first speed in the first direction and move the optical element at a second speed different from the first speed in the second direction.

Other aspects and advantages of the present invention will become apparent from the following description, taken in conjunction with the accompanying drawings, illustrating by way of example the principles of the invention.

BRIEF DESCRIPTION OF THE SEVERAL VIEWS OF THE DRAWING

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

[First Embodiment]

A fiber collimator aligning method and an aligner 100 according to a first embodiment of the present invention will be described with reference to FIGS. 1 to 4.

Figure 1:
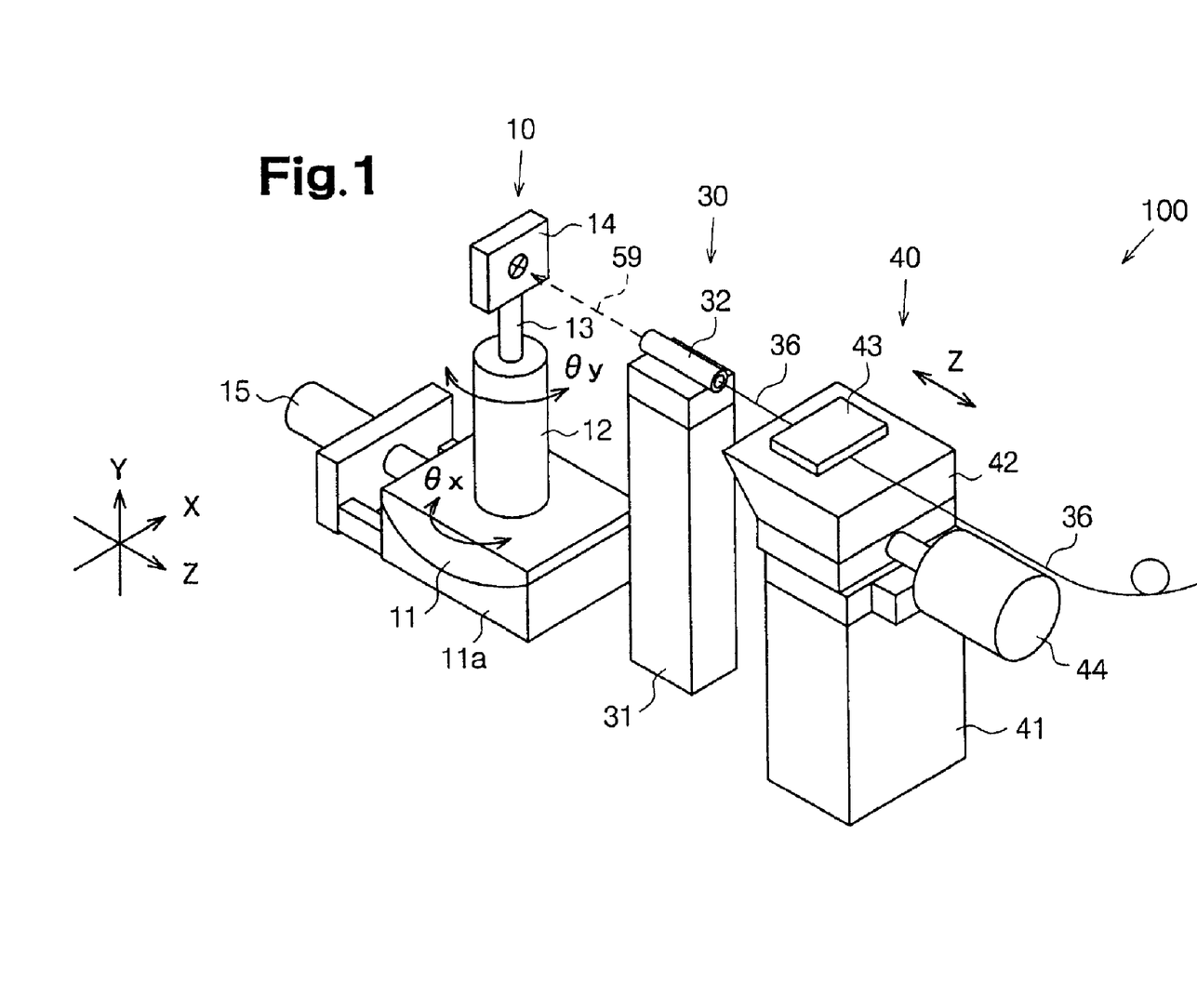
FIG. 1 is a perspective view of an aligner according to a first embodiment of the present invention.
Figure 2:
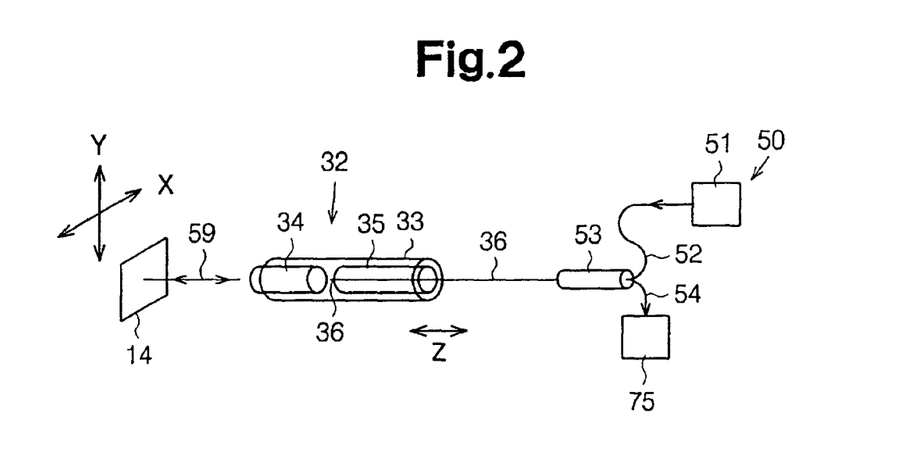
FIG. 2 is a schematic diagram of the aligner in FIG. 1.

As illustrated in FIGS. 1 and 2, the fiber collimator aligner 100 comprises a reflector 10 having an optical element, i.e., a mirror 14; a light directing unit 50 connected to an optical fiber 36 for irradiating the mirror 14 with light; an aligning seat 30 on which light reflected by the reflector 10 impinges; a movable platform 40 or an adjuster for moving the optical fiber 36 in a longitudinal direction; and a controller 70. The optical fiber 36 is inserted into the aligning seat 30.

The light directing unit 50 includes a light source 51; a first branch optical fiber 52 optically connected to the light source 51; an optical splitter 53 connected to the first branch optical fiber 52; and a second branch optical fiber 54 optically connected to the optical splitter 53. The optical splitter 53 is optically connected to the optical fiber 36. Preferably, a blocking part such as an isolator for blocking return light from the reflector 10 to the light source 51 may be provided between the first branch optical fiber 52 and the light source 51.

The reflector 10 or a scanner includes a first rotating body 11 supported on a pedestal 11a to be reciprocally rotatable about an X-axis; a second rotating body 12 supported on the first rotating body 11 to be reciprocally rotatable about a Y-axis orthogonal to the X-axis; and a mirror 14 fixed to a distal end of a shaft 13 of the second rotating body 12. The mirror 14 is rotated by the first rotating body 11 about the X-axis, and rotated by the second rotating body 12 about the Y-axis. The first rotating body 11 and the second rotating body 12 constitute a scanning mechanism.

The first rotating body 11 is rotated by an X-axis . . . rotating motor 15 in a direction indicated by an arrow θx. The second rotating body 12 is rotated by an actuator 12a (FIG. 3) such as a voice coil, a piezo actuator or the like in a direction indicated by an arrow θy. In the present invention, the first rotating body 11 differs from the second rotating body 12 in the rotating speed. More specifically, the first rotating body 11 is rotated at relatively high speeds, while the second rotating body 12 is rotated at relatively low speeds. By rotating the first rotating body 11 and the second rotating body 12, an optimal angle of the mirror 14 is scanned.

The aligning seat 30 includes a work holder 31. The work holder 31 holds a work, i.e., the collimator 32 which is to be aligned. As illustrated in FIG. 2, the collimator 32 includes a tube 33; a collimation lens 34 disposed within the tube 33; a capillary 35; and an optical fiber 36. When the capillary 35 is formed integrally with the tube 33, the collimator 32 is formed by inserting the optical fiber 36 into the capillary 35. On the other hand, when the capillary 35 is fixed to the optical fiber 36, the capillary 35 is pushed into the tube 33, fixed therein, thereby forming the collimator 32.

The movable platform 40 includes an optical fiber moving base 41; an optical fiber positioning base 42 placed on the moving base 41; an optical fiber fixing plate 43 placed on the positioning base 42; and a Z-axis slide motor 44. The optical fiber 36 is fixed on the optical fiber positioning base 42 by the optical fiber fixing plate 43. The optical fiber positioning base 42 is moved in the longitudinal direction, i.e., the Z-axis direction of the capillary 35 by the Z-axis slide motor 44.

Figure 3:
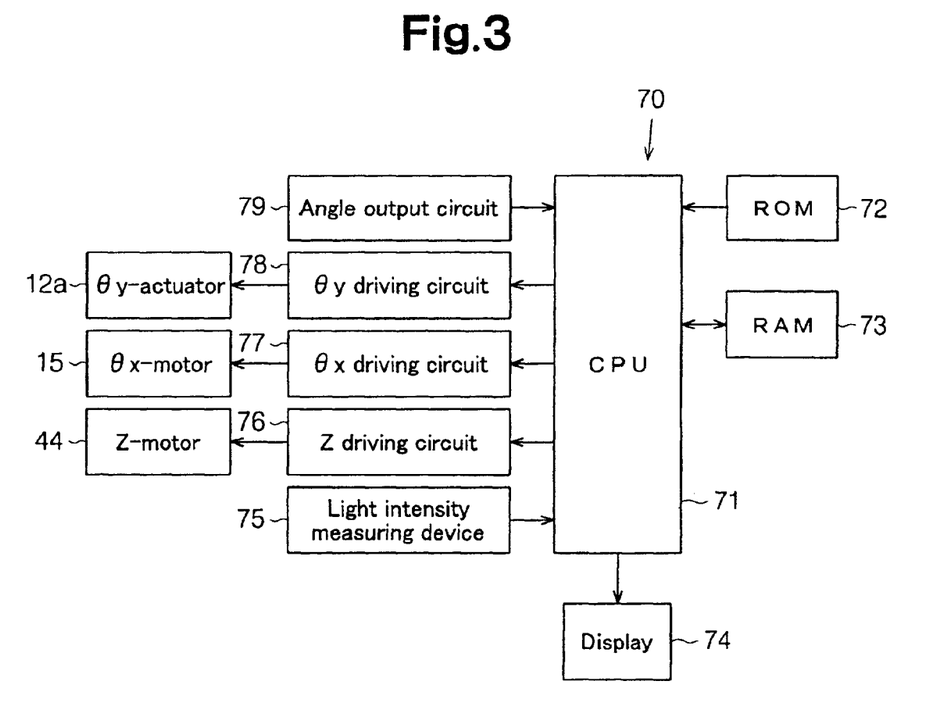
FIG. 3 is a block diagram of a controller of the aligner in FIG. 1.

FIG. 3 is a block diagram of the controller 70 for the fiber collimator aligner 100. The controller 70 includes a central processing unit (CPU) 71; a ROM 72 for storing a program illustrated in FIG. 4 and data associated therewith; a storage device or a RAM 73 for temporarily storing measured data; a Z-axis driving circuit 76; an θX-axis rotation driving circuit 77; a θY-axis rotation driving circuit 78; an angle output circuit 79; a display 74 such as a cathode ray tube for displaying results of measurements; and a light intensity measuring device 75.

The Z-axis driving circuit 76 controls the Z-axis slide motor 44. The θX-axis rotation driving circuit 77 controls driving of the θX-axis rotation motor 15 for vertically swinging the first rotating body 11. The θY-axis rotation driving circuit 78 controls driving of the θY-axis actuator 12a for horizontally swinging the second rotating body 12. The angle output circuit 79 supplies the CPU 71 with an angle (θx) of the first rotating body 11 and an angle (θy) of the second rotating body 12.

Light emitted from the light source 51 passes through the first branch optical fiber 52, the optical splitter 53 and the optical fiber 36, and is converted to parallel light 59 by the collimation lens 34. The parallel light 59 is reflected by the mirror 14, and converged by the collimation lens 34. The converged light 59 passes through the optical fiber 36, the optical splitter 53 and the second branch optical fiber 54, and impinges on the light intensity measuring device 75. The light intensity measuring device 75 measures the intensity of the incident light, and supplies the measured intensity to the CPU 71 in synchronism with the angle signals of the angle output circuit 79. The CPU 71 finds the angle at which the light intensity reaches a maximum.

The controller 70 simultaneously rotates the mirror 14 about two axes (X-axis, Y-axis) to scan a maximum value of the light intensity. Since the rotation about one of the two axes is faster than the rotation about the other axis, the controller 70 can detect the maximum value of the light intensity within a scanning range in a short time.

Figure 4:
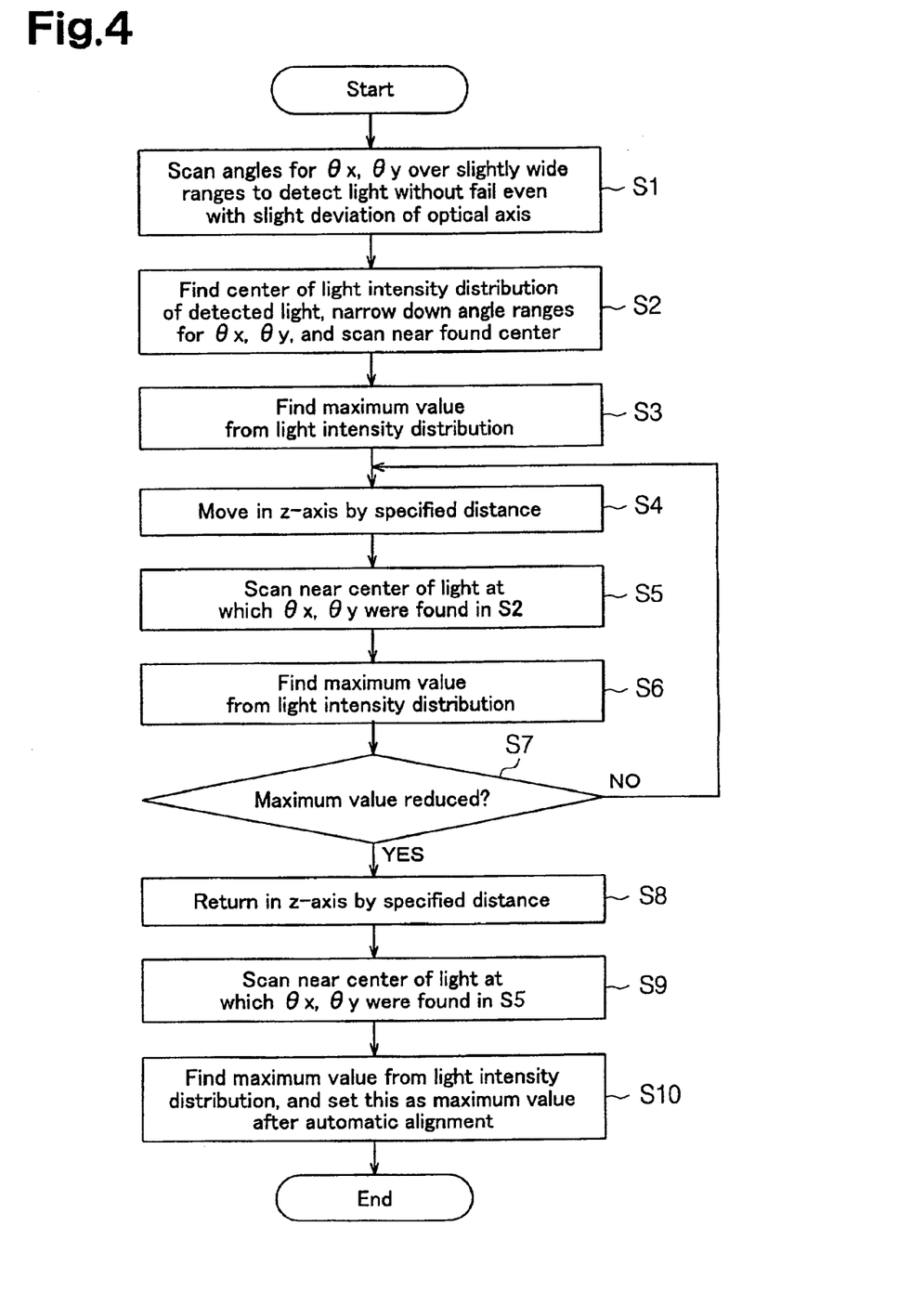
FIG. 4 is a flow chart of an aligning operation performed by the controller in FIG. 3.

Next, the aligning method according to this embodiment will be described with reference to a flow chart of FIG. 4.

In step S1, the CPU 71 sets a scanning angle range about the X-axis (rotatable range of the first rotating body 11) and a scanning angle range about the Y-axis (rotatable range of the second rotating body 12) to be slightly large. Since the scanning ranges are set relatively large, the light intensity measuring device 75 can capture the reflected light 59 anywhere within the scanning ranges even if the optical axis of the collimation lens 34 slightly deviates from the reflected light 59 of the mirror 14.

In step S2, the CPU 71 calculates the center of a light intensity distribution of the captured light 59, and calculates the angle (θx) of the first rotating body 11 and the angle (θy) of the second rotating body 12, i.e., the angles of the mirror 14, corresponding to the center. The CPU 71 reduces the scanning angle range about the X-axis and the scanning angle range about the Y-axis based on the calculated angles. The CPU 71 scans the angle at which the light intensity reaches the maximum while simultaneously rotating the first rotating body 11 and the second rotating body 12 about the two axes (X-axis and Y-axis). In this scanning, the speed of the scanning about the X-axis is several hundreds of times higher than the speed of the scanning about the Y-axis. By rotating the second rotating body 12 slowly about the Y-axis while rotating the first rotating body 11 fast about the X-axis, the set ranges can be fully scanned. The origin of the reduced scanning ranges is at an angle corresponding to the center of the light intensity distribution. Therefore, a relatively narrow range is precisely scanned near the center of the light intensity distribution. The CPU 71 stores the light intensity detected at each angle (θx, θy) of the mirror 14 in the RAM 73 for creating a light intensity distribution map.

In step S3, the CPU 71 detects a maximum value of the light intensity from the light intensity distribution map, and the angles of the mirror 14 corresponding to the maximum value, i.e., the angle (θx) of the first rotating body 11 and the angle (θy) of the second rotating body 12. The maximum value of the light intensity in step S3 is stored in the RAM 73 as an initially determined value.

In step S4, the CPU 71 drives the Z-axis slide motor 44 to move the optical fiber positioning base 42 in the Z-axis direction by a predetermined distance. In this manner, the distance between the optical fiber 36 and the collimator lens 34 is changed.

In step S5, the CPU 71 simultaneously rotates the first rotating body 11 and the second rotating body 12 about the center of intensity of the light 59 detected in step S2 to scan the angle at which the light intensity reaches the maximum. In step S5, the first rotating body 11 and the second rotating body 12 are each scanned in a relatively narrow range, similar to the case of step S2. The CPU 71 creates a light intensity distribution map representing the relationship between each angle (θx, θy) of the mirror 14 and the detected light intensity, and stores the map in the RAM 73.

In step S6, the CPU 71 detects the maximum value of the light intensity from the light intensity distribution map, and the angles of the mirror 14 corresponding to the maximum value, i.e., the angle (θx) of the first rotating body 11 and the angle (θy) of the second rotating body 12.

In step S7, the CPU 71 compares the maximum value in step S6 with the maximum value (initially determined value) in step S3. When the maximum value in step S6 is smaller than the initially determined value, the processing proceeds to step S8. Otherwise, when the maximum value in step S6 is equal to or larger than the initially determined value, the processing returns to step S4.

More specifically, if the maximum value of the light intensity is reduced than the initially determined value even after the distance between the optical fiber 36 and the collimation lens 34 is changed, a true maximum value larger than the maximum value in step S3 must exist because the initially determined value (maximum value in step S3) is not a true maximum value. In this event, the CPU 71 sets the maximum value in step S6 at the determined value in place of the maximum value in step S3, and again executes steps S4 to S7. On the other hand, when the maximum value of the light intensity is reduced by changing the distance between the optical fiber 36 and the collimation lens 34, this means that the determined value at that time is the true maximum value. In this manner, the angle of the mirror 14 opposing the collimation lens 34 is determined.

In step S8, the CPU 32 controls the Z-axis slide motor 44 to move the optical fiber positioning base 42 in the Z-axis direction. In this manner, the distance between the optical fiber 36 and the collimation lens 34 is returned to the distance previous to the change in step S4.

In step S9, the CPU 71 simultaneously rotates the first rotating body 11 and the second rotating body 12, respectively, about the center of intensity of the light 59 detected in step S5 to detect the light intensity. The CPU 71 creates a final light intensity distribution map, and stores the map in the RAM 73.

In step S10, the CPU 71 finds the maximum value of the light intensity, i.e., the value indicative of optimal alignment from the final light intensity distribution map, and stores this maximum value in the RAM 73.

The foregoing processing results in the determination of the distance between the optical fiber 36 and the collimation lens 34 at which the light intensity reaches the maximum, i.e., a relative position between the optical fiber 36 and the collimator lens 34. The optical fiber 36 is fixed to the capillary 35 at the aligned position. In this manner, the aligning operation is completed for the collimator 32.

The driving speeds (angle changing speeds), or operation frequencies, of the first and second rotating bodies 11, 12 are determined as required. Preferably, the rotation frequency of the first rotating body 11 is in a range of 100 to 1 kHz; and the rotation frequency of the second rotating body 12 is in a range of 0.1 to 10 Hz, so that the ratio of the driving speeds of the first rotating body 11 and the second rotating body 12 is in a range of 10 to 10000. More preferably, the rotation frequency of the first rotating body 11 is in a range of 200 to 600 Hz; and the rotation frequency of the second rotating body 12 is in a range of 0.2 to 5 Hz, so that the ratio of the driving speeds of the first rotating body 11 and the second rotating body 12 is in a range of 40 to 3000. Most preferably, the rotation frequency of the first rotating body 11 is in a range of 300 to 500 Hz; and the rotation frequency of the second rotating body 12 is in a range of 0.5 to 2 Hz, so that the ratio of the driving speeds of the first rotating body 11 and the second rotating body 12 is in a range of 150 to 1000. Preferably, the first rotating body 11 is a goniostage, and the second rotating body 12 is a galvanoscanner. Alternatively, the second rotating body 12 may be rotated faster than the first rotating body 11.

According to the first embodiment, the following advantages are provided.

(1) The mirror 14 is simultaneously rotated about two axes. The rotation about one of the two axes is faster than that about the other axis. Therefore, this results in a reduction in a time required for detecting the angle of the mirror at which the light intensity reaches the maximum, as compared with the conventional apparatus. As a result, a time required for the aligning operation for the collimator 32 can be shortened.

(2) The angle output circuit 79 supplies the angles of the mirror 14 to the CPU 71, and in synchronism with this, the light intensity measuring device 75 supplies the light intensity to the CPU 71. Since the CPU 71 performs signal processing, this facilitates the detection of the angle at which the light intensity reaches the maximum.

[Second Embodiment]

In the following, a fiber collimator aligning method and an aligner 200 according to a second embodiment will be described mainly on differences with the first embodiment. Similar members are designated the same reference numerals as those in the first embodiment.

Figure 5:
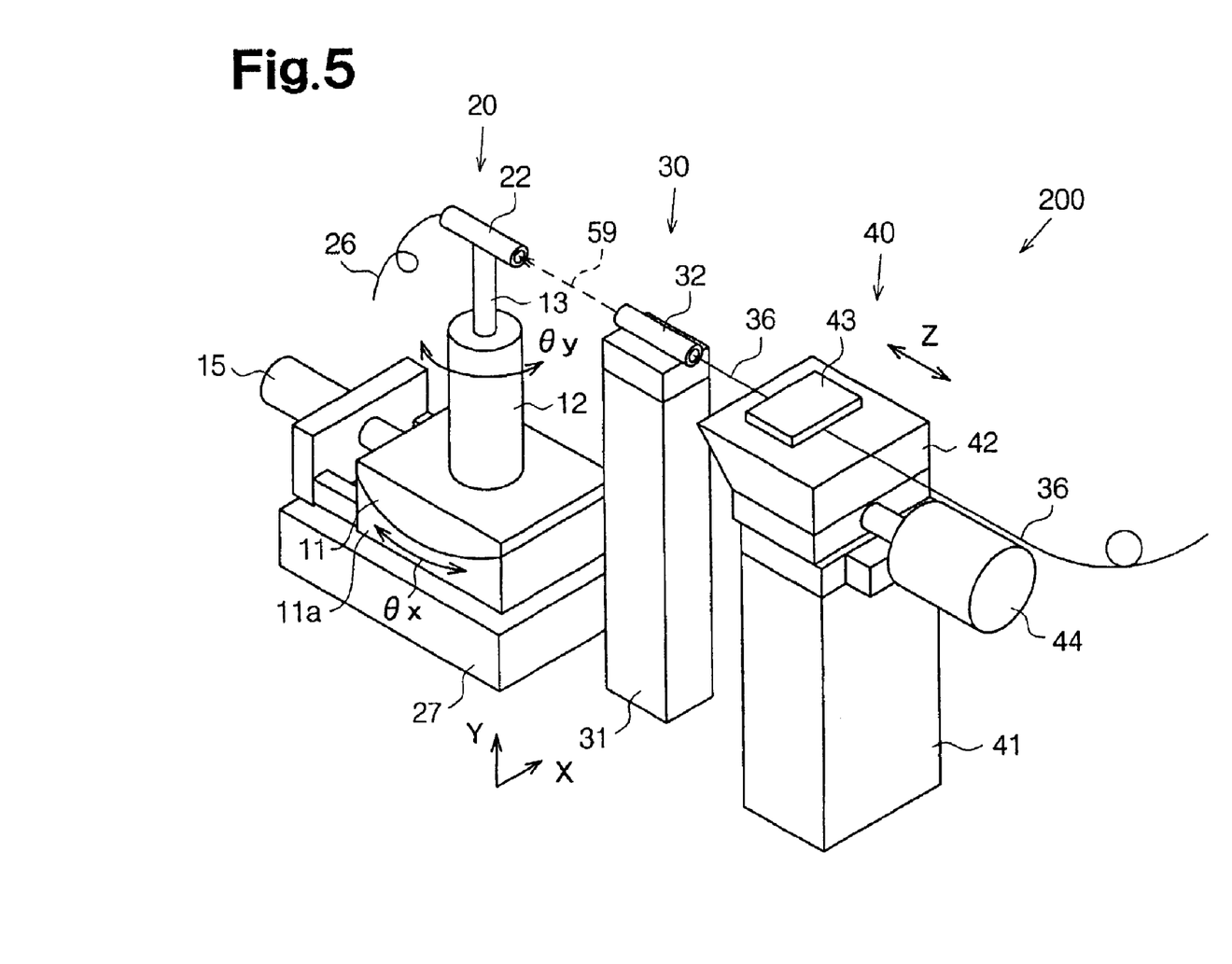
FIG. 5 is a perspective view of an aligner according to a second embodiment of the present invention.

As illustrated in FIG. 5, the fiber collimator aligner 200 of the second embodiment has an optical transmission unit 20 in place of the reflector 10 in the first embodiment. The optical transmission unit 20 includes a movable platform 27; a pedestal 11a supported by the movable platform 27; and an optical element or a master collimator 22. The movable platform 27 linearly moves the pedestal 11a simultaneously along the X-axis and Y-axis orthogonal to the optical axis of the master collimator 22. The pedestal 11a is moved along one of the X-axis and Y-axis at relatively high speeds, and moved along the other axis at relatively low speeds. A position output circuit 82 (see FIG. 7) disposed on the movable platform 27 supplies the position of the pedestal 11a (X, Y) to a CPU 71.

The optical transmission unit 20, i.e., a scanner includes a first rotating body 11 supported on the pedestal 11a to be reciprocally rotatable about the X-axis; and a second rotating body 12 supported on the first rotating body 11 to be reciprocally rotatable about the Y-axis orthogonal to the X-axis. The master collimator 22 is fixed at a distal end of a shaft 13 of the second rotating body 12, and is rotated about the X-axis by the first rotating body 11 and rotated about the Y-axis by the second rotating body 12. The first rotating body 11, the second rotating body 12 and the movable platform 27 constitute a scanning mechanism.

Figure 7:
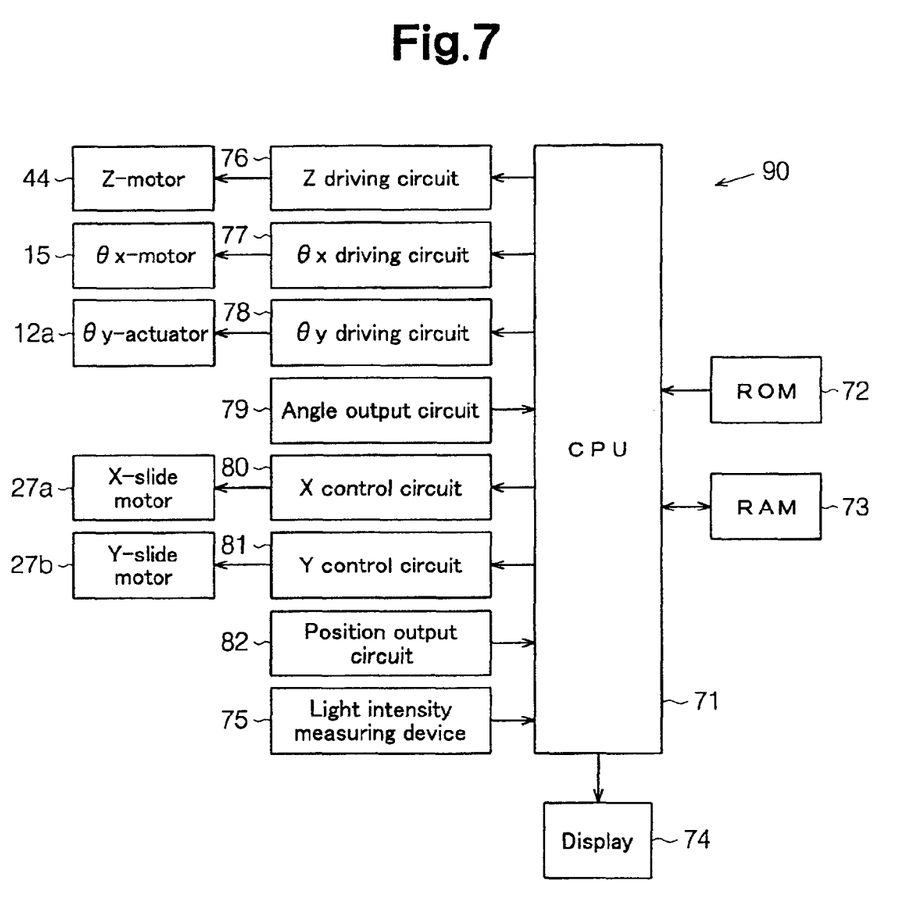
FIG. 7 is a block diagram of a controller of the aligner in FIG. 5.

FIG. 7 is a block diagram of a controller 90 of the aligner 200. The controller 90 includes an X-position control circuit 80; a Y-position control circuit 81; and a position output circuit 82. The X-position control circuit 80 controls an X-axis slide motor 27a disposed on the movable platform 27. The Y-position control circuit 81 controls a Y-axis slide motor 27b disposed on the movable platform 27.

Figure 6:
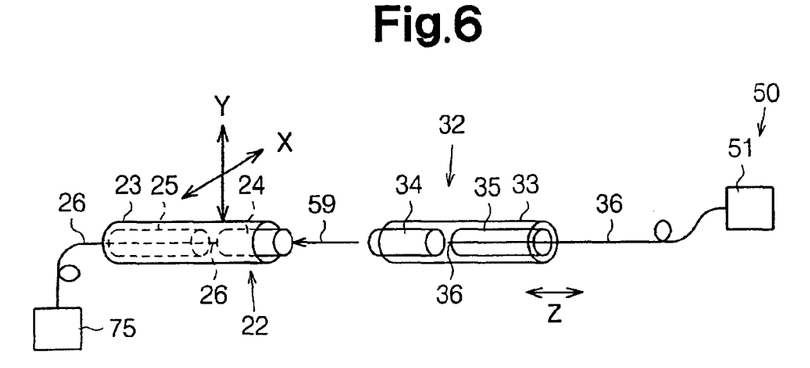
FIG. 6 is a schematic diagram of the aligner in FIG. 5.

As illustrated in FIG. 6, the master collimator 22 has a tube 23; a collimation lens 24 disposed within the tube 23; a capillary 25 disposed on the inner surface of the tube 23; and an optical fiber 26 inserted into the capillary 25.

A light directing device 50, i.e., a light source 51 is optically connected to an optical fiber 36. Light is irradiated from the light source 51 to the collimation lens 34 of the collimator 32 under testing through the optical fiber 36. The light is converted to parallel light 59 by the collimation lens 34. The parallel light 59 is converged by the collimation lens 24, and impinges on a light intensity measuring device 75 through the optical fiber 26. The light intensity measuring device 75 supplies the CPU 71 with a measured light intensity in synchronism with an angle output circuit 79 and the position output circuit 82. The CPU 71 detects the angles ($\theta x$, $\theta y$) and positions (X, Y) at which the light intensity reaches a maximum.

The master collimator 22 is rotated about the X-axis and Y-axis by the first rotating body 11 and the second rotating body 12, respectively, and also slid along the X-axis and Y-axis by the movable platform 27. In other words, the master collimator 22 can be varied simultaneously in the angles ($\theta x$, $\theta y$) and positions (X, Y).

The angles ($\theta x$, $\theta y$) of the master collimator 22 are changed, one faster than the other. Therefore, the controller 90 can detect a maximum value of the light intensity within a scanning angle range in a relatively short time. In addition, the positions (X, Y) of the master collimator 22 are also changed, one faster than the other. Therefore, the controller 90 can detect the maximum value of the light intensity within the scanning angle range in a relatively short time. Preferably, the ratio of the higher moving speed to the lower moving speed is one to several hundreds.

The maximum value of the light intensity is detected while alternately changing the angles and positions of the master collimator 22.

Figure 8:
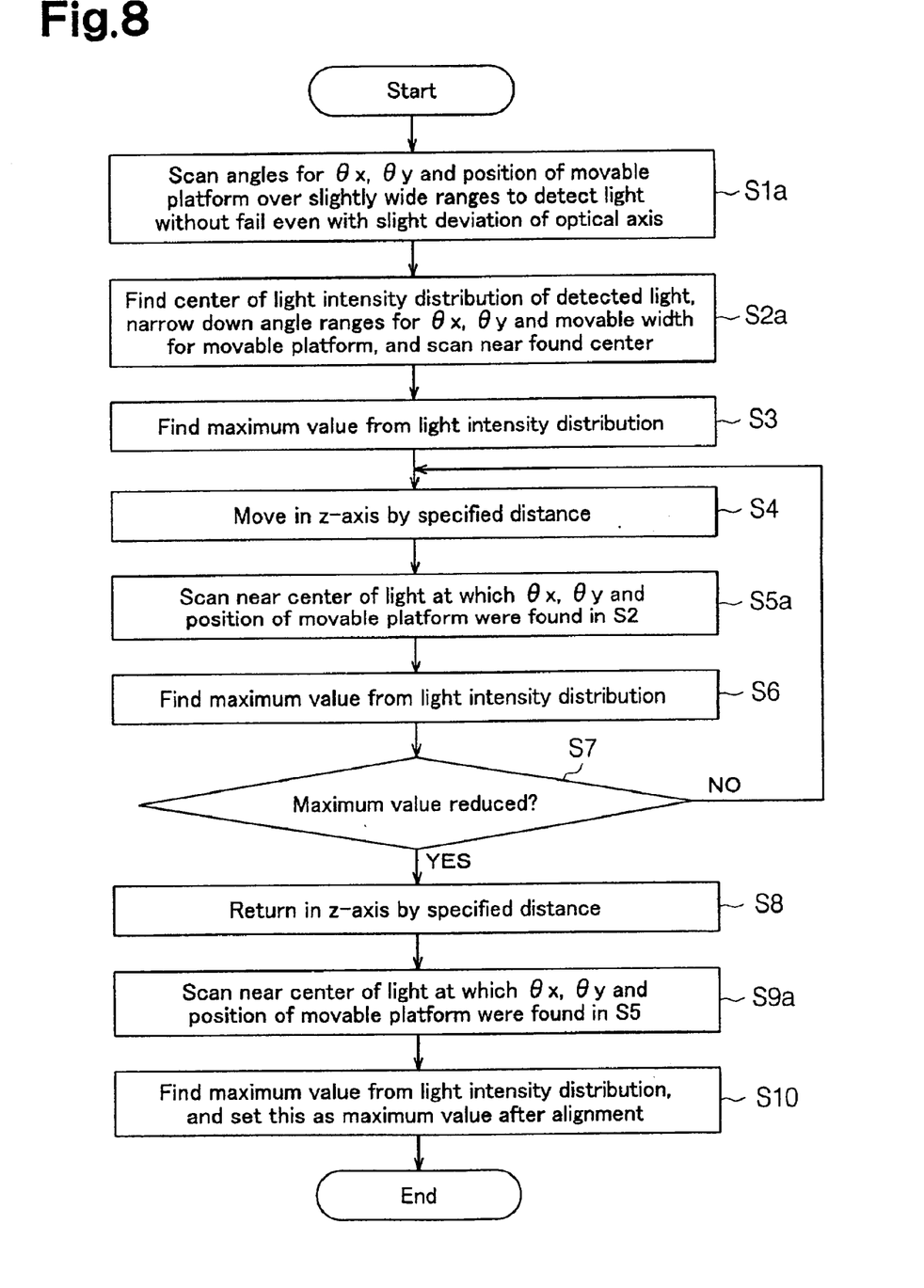
FIG. 8 is a flow chart of an aligning operation performed by the controller in FIG. 7.

FIG. 8 illustrates a flow chart of an aligning method according to the second embodiment. In the processing of FIG. 8, steps S1a, S2a, S5a and S9a are different from steps S1, S2, S5 and S9 in FIG. 4 of the first embodiment. The following description will be centered on the differences with the processing in FIG. 4.

In step S1a, the CPU 71 sets a scanning angle range about the X-axis (rotatable range of the first rotating body 11), a scanning angle range about the Y-axis (rotatable range of the second rotating body 12), an X-position range, and a Y-position range to be slightly large. Since the scanning ranges are set relatively large, the light intensity measuring device 75 can capture the reflected light 59 anywhere within the scanning ranges even if the optical axis of the collimation lens 22 slightly deviates from the collimation lens 34.

More specifically, the CPU 71 first rotates the master collimation lens 22 simultaneously about the two axes (X-axis, Y-axis) to scan a maximum value of the light intensity and the angle at which the light intensity reaches the maximum. Next, the CPU 71 fixes the master collimation lens 22 at the angle at which the light intensity reaches the maximum, and slides the movable platform 27 along the X-axis and Y-axis to scan the position at which the light intensity reaches the maximum. Further, the CPU 71 fixes the movable platform 27 at the position at which the light intensity reaches the maximum, and rotates the master collimation lens 22 simultaneously about the two axes (X-axis, Y-axis) to scan an angle at which the light intensity reaches the maximum. Then, the CPU 71 fixes the master collimation lens 22 at the angle at which the light intensity reaches the maximum, and slides the movable platform 27 along the X-axis and Y-axis to scan the position at which the light intensity reaches the maximum. The CPU 71 repeats the foregoing operations until a detected intensity from the light intensity measuring device 75 reaches a predetermined value.

In step S2a, the CPU 71 calculates the center of a light intensity distribution of the detected light 59, and sets a relatively small scanning angle range about the center. The CPU 71 simultaneously rotates the first rotating body 11 and the second rotating body 12 over the narrowed scanning angle to scan the angle of the master collimation lens 22 at which the light intensity reaches the maximum. Next, the CPU 71 sets the scanning position range for the pedestal 11a to be relatively small, and slides the pedestal 11a within the narrowed scanning position range at the angle at which the light intensity reaches the maximum, to scan the position of the master collimation lens 22 at which the light intensity reaches the maximum. Subsequently, the CPU 71 fixes the pedestal 11a at the position at which the light intensity reaches the maximum, and simultaneously rotates the first rotating body 11 and the second rotating body 12 to scan the angle of the master collimation lens 22 at which the light intensity reaches the maximum. Then, the CPU 71 fixes the first rotating body 11 and the second rotating body 12 at the angles at which the light intensity reaches the maximum, and slides the pedestal 11a simultaneously along the X-axis and Y-axis to scan the position of the master collimation lens 22 at which the light intensity reaches the maximum. The angle and position scanning is repeated until the maximum value of the light intensity hardly changes even if the angle and position of the master collimation lens 22 are changed. The CPU 71 stores the angle and position of the master collimator lens 22, and the light intensity in the RAM 73 to create a light intensity distribution map.

In step S5a, the CPU 71 simultaneously rotates the first rotating body 11 and the second rotating body 12 to scan the angle of the master collimation lens 22 at which the light intensity reaches the maximum. Next, the CPU 71 fixes the first rotating body 11 and the second rotating body 12 at the angles at which the light intensity reaches the maximum, and operates the movable platform 27 to scan the position of the master collimation lens 22 at which the light intensity reaches the maximum. Similarly to step S2a, the angle and position scanning is repeated until the maximum value of the light intensity hardly changes even if the angle and position of the master collimation lens 22 are changed. The CPU 71 stores the angle and position of the master collimator lens 22, and the light intensity in the RAM 73 to create a light intensity distribution map.

In step S9a, first, the CPU 71 simultaneously rotates the first rotating body 11 and the second rotating body 12, respectively, about the center of the light 59 detected in step S5a to detect a light intensity. Next, the CPU 71 fixes the first rotating body 11 and the second rotating body 12 at the angles at which the light intensity reaches the maximum, and operates the movable platform 27 to scan the position of the master collimation lens 22 at which the light intensity reaches the maximum. Similarly to step S2a, the angle and position scanning is repeated until the maximum value of the light intensity hardly changes even if the angle and position of the master collimation lens 22 are changed. The CPU 71 creates a final light intensity distribution map, and stores the map in the RAM 73.

The processing in FIG. 8 results in the determination of the distance between the optical fiber 36 and the collimation lens 34 at which the light intensity reaches the maximum, i.e., a relative position between the optical fiber 36 and the collimator lens 34. The optical fiber 36 is fixed to the capillary 35 at the aligned position. In this manner, the aligning operation is completed for the collimator 32.

The driving speeds (angle changing speed) of the first 10 and second rotating bodies 11, 12 in the second embodiment are similar to those in the first embodiment. On the other hand, as to the driving speed of the movable platform 27 (position changing speed), the faster one of the movements along the two axes (X-axis and Y-axis) is in a range of 100 to 1 kHz; and the slower one is in a range of 0.1 to 10 Hz, with the ratio of the two speeds ranging from 10 to 10000. More preferably, the faster movement is in a range of 200 to 600 Hz, and the slower movement is in a range of 0.2 to 5 Hz, with the ratio of the two speeds ranging from 150 to 1000. Most preferably, the faster movement is in a range of 300 to 500 Hz, and the slower movement is in a range of 0.5 to 2 Hz, with the ratio of the two speeds ranging from 40 to 3000.

According to the second embodiment, the following advantages are provided.

(3) The master collimator 22 is rotated simultaneously about the two axes, and moved simultaneously along the two axes. One of the rotations about the two axes is faster than the other. Also, one of the movements along the two axes is faster than the other. Therefore, the detection of the angles and positions of the master collimator 22, at which the light intensity reaches the maximum can be made in a shorter time.

(4) The detected light intensity is supplied to the CPU 71 in synchronism with the information on the angle and position of the master collimator 22. This facilitates the creation of the light intensity distribution map, so that the CPU 71 can detect in a shorter time the angle at which the light intensity reaches the maximum.

[Third Embodiment]

In the following, a method and an apparatus for testing a light intensity of a fiber collimator according to a third embodiment of the present invention will be described mainly on differences with the second embodiment.

Figure 9:
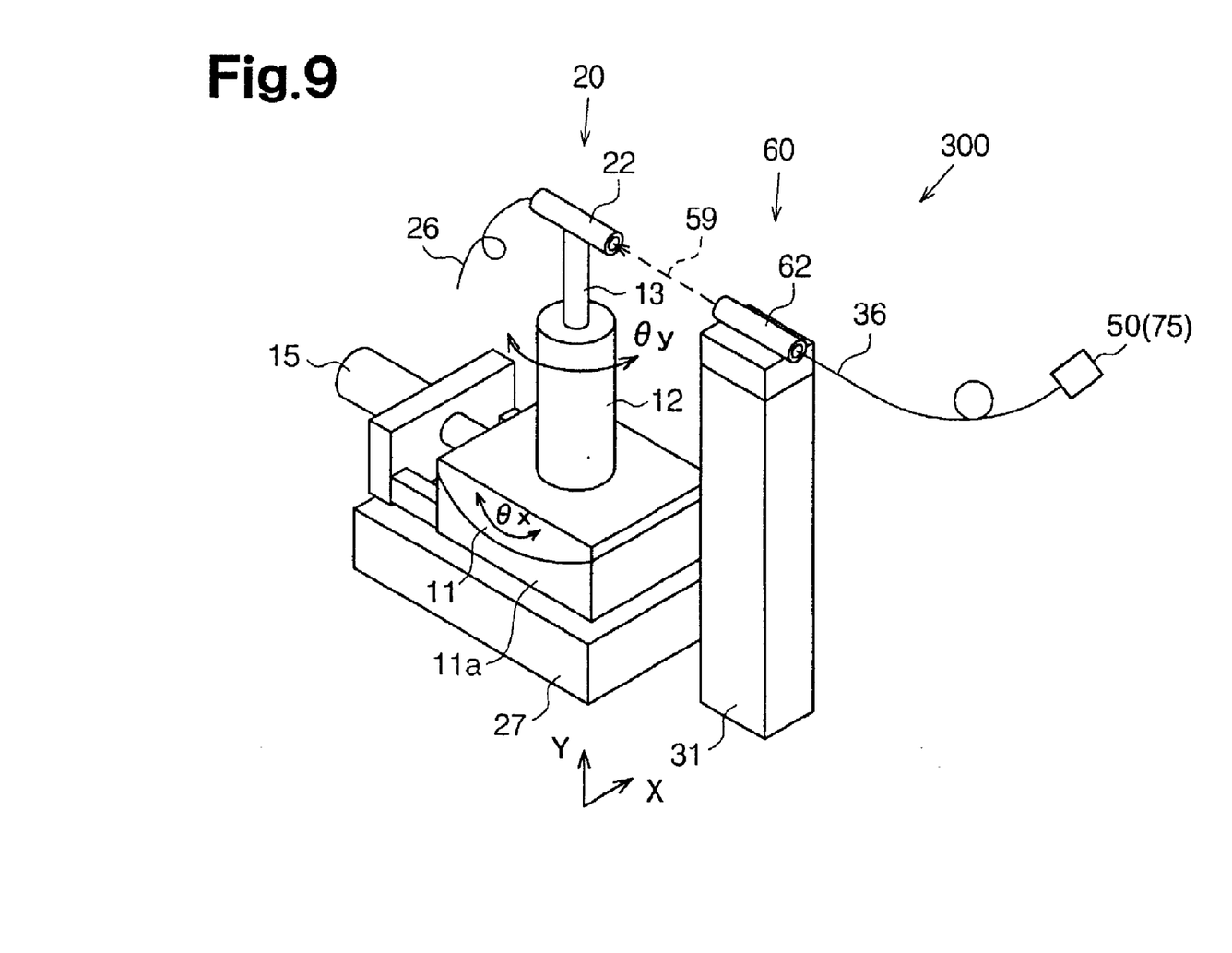
FIG. 9 is a perspective view of an aligner according to a third embodiment of the present invention.
Figure 10:
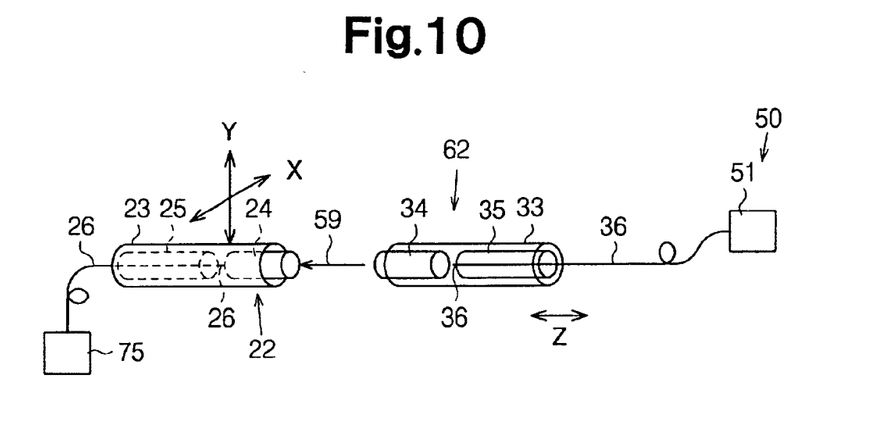
FIG. 10 is a schematic diagram of the aligner in FIG. 9.
Figure 11:
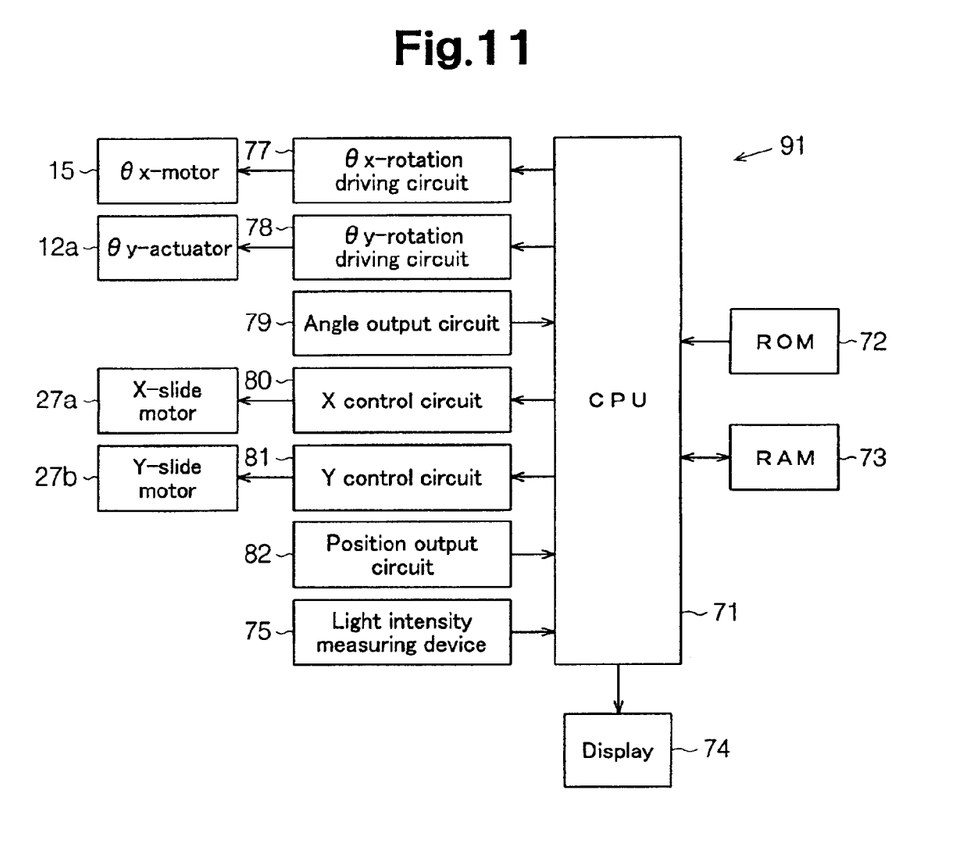
FIG. 11 is a block diagram of a controller of the aligner in FIG. 9.

FIGS. 9 to 11 illustrate a tester 300 for testing a fiber collimator 62. The tester 300 moves an optical element, i.e., a master collimator 22 to test the collimator 62. The tester 300 has a testing seat 60 in place of the aligning seat 30 in FIG. 5, and omits the movable platform 40. The collimator 62 (FIG. 10) under testing is the same as the collimator 32 in FIG. 6.

FIG. 11 is a block diagram of a controller 91 of the tester 300. The controller 91 omits the Z-axis slide motor 44 and the Z-axis driving circuit 76 in FIG. 7. The rest of the controller 91 is similar to the controller 90 in FIG. 7.

Figure 12:
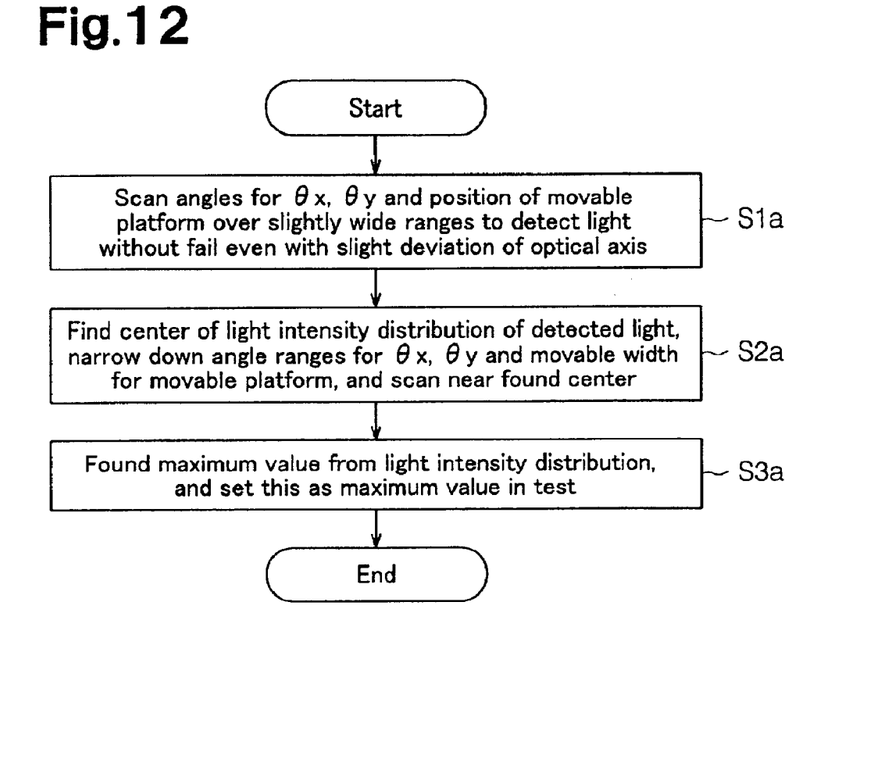
FIG. 12 is a flow chart of an aligning operation performed by the controller in FIG. 11.

FIG. 12 is a flow chart of a testing method according to the third embodiment. Steps S1a, S2a in this flow chart are the same as steps S1a, S2a in FIG. 8. In steps S1a and S2a, the tester 300 scans a maximum value of a light intensity while alternately changing the angles ($\theta x$, $\theta y$) and positions (X, Y) of the master collimator 22.

In step S3a, the CPU 71 reads the maximum value of the light intensity from a light intensity distribution map, and writes the maximum value into the RAM 73. In this manner, the collimator 62 under testing is tested for the maximum intensity of the light emitted therefrom.

The scanning speeds of the master collimator 22 in the third embodiment are similar to those of the second embodiment.

According to the third embodiment, the following advantages are provided.

(5) The tester 300 drives the master collimator 22 within a predetermined angle range and position range to detect the maximal light intensity of the collimator 62 under testing. One of the angles ($\theta x$, $\theta y$) of the master collimator 22 is changed faster than the other, and one of the positions (X, Y) of the master collimator 22 is changed faster than the other. Therefore, the tester 300 can detect in a relatively short time the maximum value of the light intensity within the scanning ranges to reduce a testing time for the collimator under testing.

The first through third embodiments may be modified in the following manner.

In the first embodiment, the first rotating body 11 and the second rotating body 12 change the angle of the optical axis of the collimator 32 to the optical axis of the mirror 14. Therefore, in the first embodiment, the first rotating body 11 and the second rotating body 12 may move the collimator 32 instead of moving the mirror 14. In this case, the advantages of the first embodiment can be still provided.

In the second embodiment, the first rotating body 11 and the second rotating body 12 change the angle of the optical axis of the master collimator 22 to the optical axis of the collimator 32, and the movable platform 27 changes the relative position of the master collimator 22 to the collimator 32. Therefore, in the second embodiment, the first rotating body 11, the second rotating body 12 and the movable platform 27 may move the collimator 32 instead of moving the master collimator 22. Alternatively, the collimator 32 may be rotated by the first rotating body 11 and the second rotating body 12, while the master collimator 22 may be moved by the movable platform 27. Further alternatively, the collimator 32 may be moved by the movable platform 27, while the master collimator 22 may be rotated by the first rotating body 11 and the second rotating body 12. In this case, the advantages of the second embodiment can be still provided.

In the second embodiment, the light source 51 and the light intensity measuring device 75 may be reversed in position. Specifically, the light source 51 may be connected to the master collimator 22, and the light intensity measuring device 75 to the collimator 32. In this configuration, the light from the light source 51 is irradiated from the master collimator 22 through the optical fiber 26. The light impinges on the light intensity measuring device 75 through the collimator 32 and the optical fiber 36. In this case, the advantages of the second embodiment can be still provided.

In the third embodiment, the first rotating body 11 and the second rotating body 12 change the angle of the optical axis of the master collimator 22 to the optical axis of the collimator 62 under testing, while the movable platform 27 changes the relative position of the master collimator 22 to the collimator 62 under testing. Therefore, in the third embodiment, the first rotating body 11, the second rotating body 12 and the movable platform 27 may move the collimator 62 under testing instead of moving the master collimator 22. Alternatively, the collimator 62 under testing may be rotated by the first rotating body 11 and the second rotating body 12, while the master collimator 22 may be moved by the movable platform 27. Further alternatively, the collimator 62 under testing may be moved by the movable platform 27, while the mater collimator 22 may be rotated by the first rotating body 11 and the second rotating body 12. In this case, the advantages of the third embodiment can be still provided.

In the third embodiment, the light source 51 and the light intensity measuring device 75 may be reversed in position. Specifically, the light source 51 may be connected to the master collimator 22, and the light intensity measuring device 75 to the collimator 62 under testing. In this case, the light from the light source 51 is irradiated from the master collimator 22 through the optical fiber 26. The light impinges on the light intensity measuring device 75 through the collimator 62 under testing and the optical fiber 36. In this case, the advantages of the third embodiment can be still provided.

The collimator 62 under testing in the third embodiment may be tested using the aligner 200 of the second embodiment. In other words, the aligner 200 may execute the testing method in FIG. 12. In this case, the aligner 200 of the second embodiment can be used for either of the testing and alignment for a collimator.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A method of testing an optical collimator having an optical axis using a mirror for reflecting light emitted from the optical collimator, the method comprising the steps of:
   moving either one of the mirror and the optical collimator; and
   measuring the intensity of light reflected by the mirror to the optical collimator and passing through the optical collimator while moving said either one of the mirror and the optical collimator, wherein the step of moving said either one of the mirror and the optical collimator includes:
   reciprocally rotating said either one of the mirror and the optical collimator about a first axis substantially orthogonal to the optical axis at a first speed; and
   reciprocally rotating said either one of the mirror and the optical collimator about a second axis substantially orthogonal to the optical axis and the first axis at a second speed different from the first speed simultaneously with the rotating about the first axis.

2. The light intensity testing method according to claim 1, further comprising the step of storing a position of said either one of the mirror and the optical collimator at which a measured light intensity reaches a maximum.

3. The testing method according to claim 1, wherein the step of moving said either one of the mirror and the optical collimator further includes the step of:
   reciprocally sliding said either one of the mirror and the optical collimator at a third speed along the first axis; and
   reciprocally sliding said either one of the mirror and the optical collimator along the second axis at a fourth speed higher than the third speed simultaneously with the sliding along the first axis.

4. The method according to claim 1, wherein said either one of the mirror and the optical collimator is reciprocally rotated within a predetermined scanning range in the first direction and the second direction, and wherein the second speed is in a range of 100 Hz to 1 kHz, and the first speed is in a range of 0.1 to 10 Hz.

5. The method according to claim 3, wherein each of the second speed and the fourth speed is in a range of 100 Hz to 1 kHz, and each of the first speed and the third speed is in a range of 0.1 to 10 Hz.

6. A method of testing a first optical collimator using a second optical collimator for receiving light irradiated from the first optical collimator and positioned on an optical axis of the first optical collimator, the method comprising the steps of:
   moving either one of the first and second optical collimators; and
   measuring the intensity of light passing through the second optical collimator, while moving said either one of the first and second optical collimators, wherein the step of moving said either one of the mirror and the optical collimator includes:
   reciprocally rotating either one of the first and second optical collimators at the first speed about a first axis orthogonal to the optical axis;
   reciprocally rotating said either one of the first and second optical collimators about a second axis orthogonal to the optical axis and the first axis at a second speed different from the first speed simultaneously with the rotating about the first axis;
   reciprocally sliding said either one of the first and second optical collimators at a third speed along the first axis; and
   reciprocally sliding said either one of the first and second optical collimators at a fourth speed different from the third speed along the second axis simultaneously with the sliding along the first axis.

7. The light intensity testing method according to claim 6, further comprising the step of storing a position of said either one of the first and second optical collimators at which a measured light intensity reaches a maximum.

8. The method according to claim 6, wherein said either one of the mirror and the optical collimator is reciprocally rotated and reciprocally slid simultaneously within a predetermined scanning range, and wherein each of the second speed and the fourth speed is in a range of 100 Hz to 1 kHz, and each of the first speed and the third speed is in a range of 0.1 to 10 Hz.

9. A method of aligning a collimation lens and an optical fiber which form an optical collimator having an optical axis, comprising the steps of:
  moving an optical element positioned to substantially oppose the optical collimator;
  measuring the intensity of light that is incident on the optical element and passes through the optical collimator while moving the optical element; and
  adjusting the distance between the collimation lens and the optical fiber based on the result of measurement, wherein the step of moving includes:
    reciprocally rotating the optical element about a first axis substantially orthogonal to the optical axis at a first speed; and
    reciprocally rotating the optical element about a second axis substantially orthogonal to the optical axis and the first axis at a second speed different from the first speed simultaneously with the rotating about the first axis.

10. The method according to claim 9, further comprising the step of storing a position of the optical element and the measured light intensity.

11. The method according to claim 10, wherein the step of adjusting includes fixing the optical element at a position at which the measured light intensity reaches a maximum, and sliding the optical fiber along the optical axis.

12. The method according to claim 9, wherein the optical collimator has a tube and a capillary disposed in the tube for receiving the optical fiber, and the step of adjusting includes sliding the optical fiber along the capillary and fixing the optical fiber to the capillary.

13. The method according to claim 9, wherein the step of moving further includes:
  reciprocally sliding the optical element at a third speed along the first axis; and
  reciprocally sliding the optical element along the second axis at a fourth speed different from the third speed simultaneously with the sliding along the first axis.

14. A method of aligning a collimation lens and an optical fiber which form an optical collimator using an optical element optically coupled to the optical collimator, the optical collimator having an optical axis, the method comprising the steps of:
  moving the optical collimator;
  measuring the intensity of light that passes through the optical collimator while moving the optical collimator; and
  adjusting the distance between the collimation lens and the optical fiber based on the result of measurement, wherein the step of moving includes:
    reciprocally rotating the optical collimator about a first axis substantially orthogonal to the optical axis at a first speed; and
    reciprocally rotating the optical collimator about a second axis substantially orthogonal to the optical axis and the first axis at a second speed different from the first speed simultaneously with the rotating about the first axis.

15. The method according to claim 14, further comprising the step of storing a position of the optical collimator and the measured light intensity.

16. The method according to claim 15, wherein the step of adjusting includes holding the optical collimator at a position at which a measured light intensity reaches a maximum and sliding the optical fiber along the optical axis.

17. The method according to claim 14, wherein the optical collimator has a tube and a capillary disposed in the tube for receiving the optical fiber, and the step of adjusting includes sliding the optical fiber along the capillary and fixing the optical fiber to the capillary.

18. A tester for testing an optical collimator, the tester comprising:
  an optical element positioned on an optical axis of light;
  a scanning mechanism for rotatably and slidably holding the optical element;
  an optical sensor for measuring the intensity of light passing through the optical collimator; and
  a controller for testing the optical collimator based on the measured intensity of light, the controller controlling the scanning mechanism to reciprocally rotate the optical element at a first speed about a first axis orthogonal to the optical axis; reciprocally rotate the optical element about a second axis orthogonal to the optical axis and the first axis at a second speed different from the first speed simultaneously with the rotating about the first axis; reciprocally slide the optical element at a third speed along the first axis; and reciprocally slide the optical element at a fourth speed different from the third speed along the second axis simultaneously with the sliding along the first axis, while measuring the intensity of the light.

19. A tester for testing an optical collimator having an optical axis, the tester comprising:
  a holder for holding the optical collimator;
  an optical element positioned on the optical axis to optically couple to the optical collimator;
  a scanning mechanism for rotatably and slidably holding at least one of the optical element and the optical collimator;
  an optical sensor for measuring the intensity of light passing through the optical collimator; and
  a controller for testing the work based on the measured intensity of light, the controller controlling the scanning mechanism to reciprocally rotate said at least one of the optical element and the optical collimator at a first speed about a first axis orthogonal to the optical axis; reciprocally rotate said at least one of the optical element and the optical collimator about a second axis orthogonal to the optical axis and the first axis at a second speed different from the first speed simultaneously with the rotating about the first axis; reciprocally slide said at least one of the optical element and the optical collimator at a third speed along the first axis; and reciprocally slide said at least one of the optical element and the optical collimator at a fourth speed different from the third speed along the second axis simultaneously with the sliding along the first axis, while measuring the intensity of the light.

20. The tester according to claim 19, wherein the controller includes a storage device for storing a position of the optical collimator or the optical element, and a measured light intensity.

21. The tester according to claim 19, wherein the optical collimator is fixed, and the optical element is moved by the scanning mechanism.

22. The tester according to claim 19, wherein the optical element is a mirror, and the sensor measures the intensity of light reflected by the mirror and passing through the optical collimator.

23. The tester according to claim 19, wherein the optical element is a collimator, and the sensor measures the intensity of light which transmits the collimator.

24. An apparatus for aligning an optical collimator, the apparatus comprising:

an optical element positioned on an optical axis of light;

a holder for holding the optical collimator to oppose the optical element;

a scanning mechanism for rotatably and slidably holding at least one of the optical element and the optical collimator;

an optical sensor for measuring the intensity of light passing through the optical collimator; and a controller for controlling the scanning mechanism, the controller controlling the scanning mechanism to reciprocally rotate said at least one of the optical element and the optical collimator at a first speed about a first axis orthogonal to the optical axis; reciprocally rotate said at least one of the optical element and the optical collimator about a second axis orthogonal to the optical axis and the first axis at a second speed different from the first speed simultaneously with the rotating about the first axis; reciprocally slide said at least one of the optical element and the optical collimator at a third speed along the first axis; and reciprocally slide said at least one of the optical element and the optical collimator at a fourth speed different from the third speed along the second axis simultaneously with the sliding along the first axis, while measuring the intensity of the light, and the controller determining an optimal relative position between the optical element and the optical collimator based on the measured intensity of the light; and an adjuster for movably holding the optical fiber along the optical axis, the adjuster changing the distance between the collimation lens and the optical fiber.

25. The apparatus according to claim 24, wherein the controller includes a storage device for storing a moving distance of the optical fiber along the optical axis.

26. The apparatus according to claim 24, wherein the optical collimator to be aligned includes a collimation lens, an optical fiber, a capillary for slidably receiving the optical fiber, and a tube for connecting the capillary and the collimation lens so that the optical fiber and the collimation lens are optically coupled each other, wherein the relative position between the optical fiber and the collimation lens is defined by the capillary and the tube except for the distance between the optical fiber and the collimation lens, and wherein after the adjustment by the adjuster, the optical fiber is secured to the capillary at the adjusted position where a measured light intensity is a maximum.

27. A method of aligning a work having an optical fiber and a collimation lens, the method comprising the steps of:

rotating a mirror disposed on an optical axis of the work to irradiate the work with reflected light about a first axis and a second axis orthogonal to the optical axis over a relatively wide range;

capturing reflected light passing through the work while rotating the mirror;

measuring the intensity of the reflected light while rotating the mirror in a relatively narrow scanning range near a position of the mirror at which the reflected light is captured, the mirror being rotated about the first axis at a first speed and being rotated about the second axis at a second speed higher than the first speed;

storing a maximum value of the measured light intensity and the position of the mirror;

moving the optical fiber along the optical axis by a predetermined distance;

measuring the intensity of the reflected light while rotating the mirror in a relatively narrow scanning range near the stored position of the mirror, the steps of rotating, storing and moving being repeated until the maximum value of the measured light intensity becomes smaller than the stored maximum value of the light intensity;

returning the position of the optical fiber by the predetermined distance when the maximum value of the measured light intensity is smaller than the stored maximum value of the light intensity; and fixing the optical fiber at the returned position.

28. The method according to claim 27, wherein the first speed is in a range of 0.1 to 10 Hz, and the second speed is in a range of 100 Hz to 1 kHz.

29. The method according to claim 27, further comprising the step of sliding the mirror along the first axis and the second axis after rotating the mirror in the relatively narrow scanning range.

* * * * *